United States Patent
Cho et al.

(10) Patent No.: US 7,570,511 B2
(45) Date of Patent: Aug. 4, 2009

(54) SEMICONDUCTOR MEMORY DEVICE HAVING A THREE-DIMENSIONAL CELL ARRAY STRUCTURE

(75) Inventors: Woo-Yeong Cho, Gyeonggi-do (KR); Sang-Beom Kang, Gyeonggi-do (KR); Du-Eung Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 73 days.

(21) Appl. No.: 11/755,329

(22) Filed: May 30, 2007

(65) Prior Publication Data
US 2008/0112209 A1     May 15, 2008

(30) Foreign Application Priority Data
Nov. 10, 2006   (KR) ...................... 10-2006-0110966

(51) Int. Cl.
*G11C 11/00* (2006.01)

(52) U.S. Cl. .......................... 365/163; 365/51; 365/148; 365/189.16; 365/230.03

(58) Field of Classification Search .................. 365/51, 365/148, 163, 46, 189.16, 230.06, 230.02, 365/231, 238, 158, 171, 130
See application file for complete search history.

(56) References Cited

U.S. PATENT DOCUMENTS

| | | | |
|---|---|---|---|
| 7,383,476 B2 * | 6/2008 | Crowley et al. | ............. 714/723 |
| 2003/0227795 A1 | 12/2003 | Seyyedy et al. | |
| 2004/0057276 A1 | 3/2004 | Nejad et al. | |
| 2004/0165431 A1 | 8/2004 | Guterman et al. | |
| 2004/0190360 A1 * | 9/2004 | Scheuerlein | ............. 365/225.7 |
| 2004/0213044 A1 | 10/2004 | Seyyedy et al. | |
| 2005/0041467 A1 | 2/2005 | Chen | |
| 2005/0110117 A1 * | 5/2005 | Hsu | ........................ 257/536 |
| 2005/0226041 A1 | 10/2005 | Nejad et al. | |
| 2006/0221752 A1 * | 10/2006 | Fasoli et al. | ............ 365/230.03 |

* cited by examiner

*Primary Examiner*—Hoai V Ho
*Assistant Examiner*—Fernando N Hidalgo
(74) *Attorney, Agent, or Firm*—Myers Bigel Sibley & Sajovec

(57) ABSTRACT

A semiconductor memory device includes a plurality of cell array layers including a plurality of word lines extending in a first direction, a plurality of bit lines extending in a second direction that intersects the first direction, and a plurality of memory cells disposed at intersections of the word lines and the bit lines. Each of the word lines has a word line position, each of the bit lines has a bit line position, and each of the memory cells includes a variable resistance device in series with a diode. The cell array layers are arranged in layers in a third direction that is perpendicular to the first and second directions. The bit lines of each of the cell array layers having a same bit line position are connected to a common column selector transistor, or the word lines of the cell array layers having a same word line position are connected to a common word line driver.

16 Claims, 7 Drawing Sheets

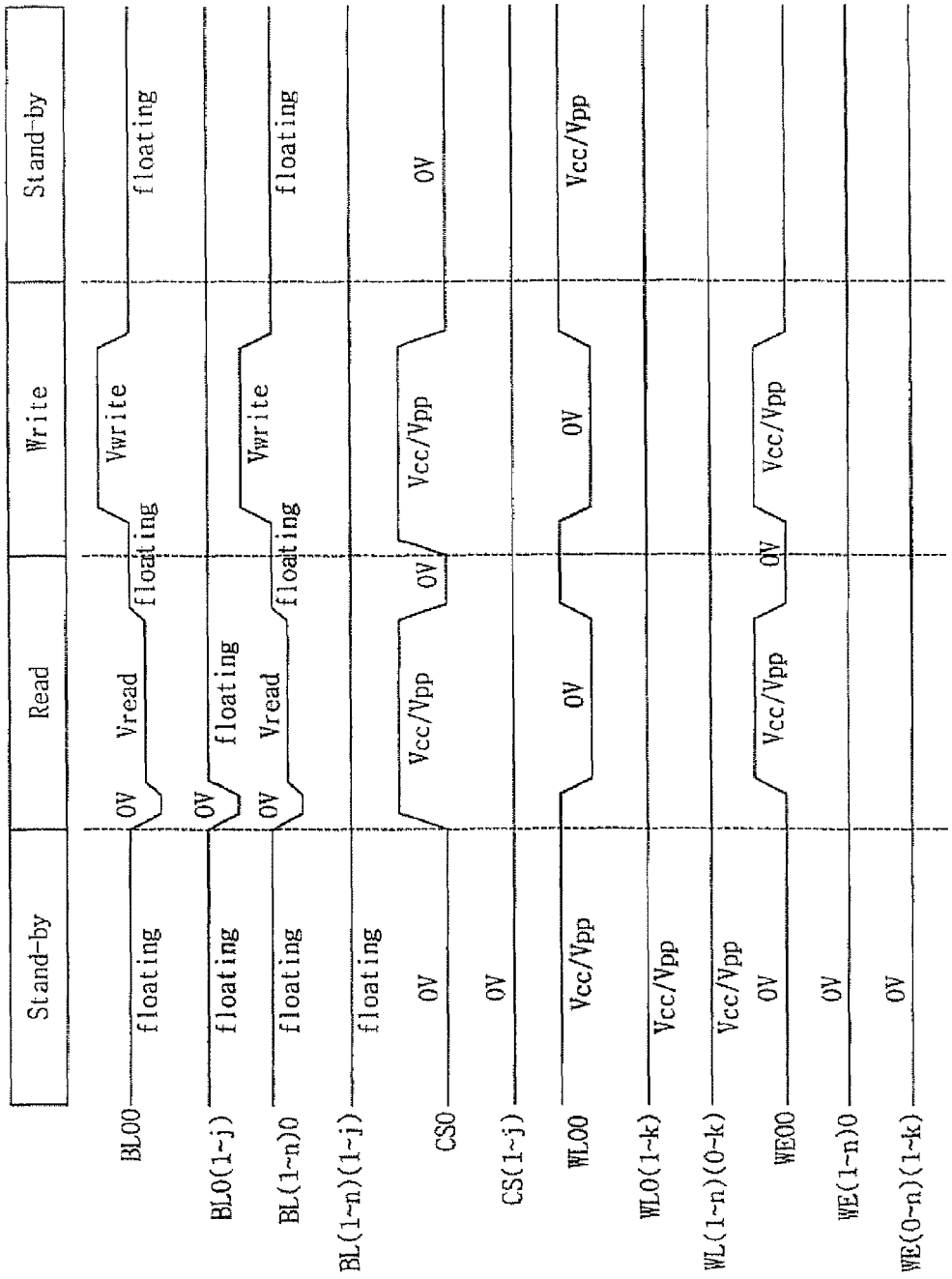

SEMICONDUCTOR MEMORY DEVICE HAVING A THREE-DIMENSIONAL CELL ARRAY STRUCTURE

CROSS REFERENCE TO RELATED APPLICATIONS

This application claims priority under 35 U.S.C. § 119 from Korean Patent Application 10-2006-0110966, filed on Nov. 10, 2006, the disclosure of which is hereby incorporated by reference in its entirety for all purposes as if fully set forth herein.

FIELD OF THE INVENTION

The present invention relates to semiconductor memory devices, and more particularly, to a semiconductor memory device having a three-dimensional cell array structure.

BACKGROUND

Unlike conventional dynamic random access memories (DRAMs), next-generation memory devices may be nonvolatile and may not require a refresh operation to maintain the data stored therein. Research on memory devices has focused on increasing data storage capacity and decreasing power consumption. Some next-generation memory devices currently being researched include a PRAM (Phase-change Random Access Memory) formed of phase change material, an RRAM (Resistance Random Access Memory) formed of material having properties of variable resistance, and an MRAM (Magnetic Random Access Memory) formed of a ferromagnetic material.

In the next generation memory devices, the PRAM employs phase change material as a storing medium. The phase change material may include a material, such as a chalcogenide, in which a phase of the material is changed in response to a temperature change. Changing the phase of the material may also change the resistance of the material. A material such as $Ge_xSb_yTe_z$ (hereinafter, referred to as 'GST') may be used as the phase change material (GST being an alloy of germanium, antimony and tellurium).

A phase change material that can be used for semiconductor memory devices is capable of being quickly changed between an amorphous state and a crystalline state.

The phase change material has a high resistance in the amorphous state and has a low resistance in the crystalline state. Thus, the amorphous state may be defined as a reset state RESET or logic '1' and the crystalline state for the phase change material may be defined as a set state SET or logic '0', or vice versa, in its application to the semiconductor memory devices.

PRAM memory cells may be classified into a transistor structure and a diode structure. In the transistor PRAM structure, a memory cell structure including phase change material is coupled in series to an access transistor. In the diode structure, a memory cell structure including phase change material is coupled in series to a diode. An example of a PRAM including memory cells of the transistor and diode structure is disclosed in U.S. Pat. No. 6,760,017.

As compared with the PRAM employing the transistor structure, the PRAM employing the diode structure may have the advantage of applying a write current that increases exponentially in response to an applied voltage. Furthermore, the diode structure may not be subject to the same size limitations as transistor structures. Thus, it may be possible by using the diode structure to reduce memory cell and/or overall chip size. Thus, the use of PRAM devices having memory cells of a diode structure is expected to increase in semiconductor memory devices requiring high integration, high speed and/or low power consumption.

FIG. 1 illustrates a memory cell of a diode structure in a general PRAM device.

Referring to FIG. 1, a memory cell 50 in the PRAM includes a diode D and a variable resistance device R. The variable resistance device R may include a phase change material as described above.

The diode D of the memory cell 50 is coupled between a word line WL and the variable resistance device R. A cathode terminal of the diode D is coupled to the word line WL, and an anode terminal of the diode D is coupled to one end of the variable resistance device R. Another end of the variable resistance device R is coupled to a bit line BL.

In the semiconductor memory device employing a memory cell of the diode structure described above, the variable resistance device R is provided as a data storage element, and a write operation using a reversible characteristic of the variable resistance device R is performed according to a magnitude of current and voltage source applied to the memory cell through the bit line BL. In other words, in performing the write operation to the memory cell 50, current is supplied through the bit line BL, and a voltage on the word line WL is set at low level or ground level. Thus, a forward bias is applied to the diode D and a current path is formed from the bit line BL to the word line WL. In response, a phase change is generated in the variable resistance device R which causes the variable resistance device R to become 'set' (e.g. to a low resistance state) or 'reset' (e.g. to a high resistance state).

In a read operation, data may be read according to the amount of current flowing through the memory cell and according to the state of the memory cell (i.e. whether the cell is in a 'set' or 'reset' state). When the variable resistance device R within the memory cell is in a 'reset' state, the memory cell has a high resistance value, so that a relatively small quantity of current flows in response to a constant voltage level applied to the bit line BL. When the memory cell is in a 'set' state, the memory cell has a low resistance value, so that a relatively large amount of current may flow.

SUMMARY

A semiconductor memory device according to some embodiments of the invention includes a plurality of cell array layers including a plurality of word lines extending in a first direction, a plurality of bit lines extending in a second direction that intersects the first direction, and a plurality of memory cells disposed at intersections of the word lines and the bit lines. Each of the memory cells includes a variable resistance device in series with a diode.

The cell array layers are arranged in layers in a third direction that is perpendicular to the first and second directions. Respective bit lines of each of the cell array layers are connected in common to respective column selector transistor or the word lines of the cell array layers are connected in common to respective word line drivers.

In some embodiments, commonly connected word lines are connected to respective common word line drivers, and the device may further include a plurality of column selector transistors. Each of the column selector transistors is coupled to a respective bit line of a respective cell array layer so that respective bit lines of the respective cell array layers have mutually different addresses.

A word line selected for a selection of a memory cell is configured to be maintained at a ground voltage level together with other commonly connected word lines, and the remaining word lines are configured to be maintained at a voltage level of a power source voltage or a voltage level higher than the power source voltage.

Bit lines other than a selected bit line are configured to be maintained at a floating state when a read voltage or a write voltage is applied to the selected bit line.

In some embodiments, commonly connected bit lines of each of the cell array layers are connected to the common column selector transistor, and the device may further include a plurality of word line drivers. Each of the word line drivers is coupled to a respective word line of a respective cell array layer so that respective word lines of the cell array layers have mutually different addresses and are individually driven by the respective word line drivers.

A word line selected for the selection of a memory cell is configured to be maintained at a ground voltage level, and the remaining word lines are configured to have a voltage level of a power source voltage or a voltage level higher than the power source voltage.

Bit lines, other than a selected bit line and bit lines commonly connected to the selected bit line, are configured to be maintained at a floating state when a read voltage or a write voltage is applied to the selected bit line.

A diode of the memory cell may include amorphous silicon, SiGe, and/or poly-crystalline silicon.

Some embodiments of the invention provide a cell array structure of a semiconductor memory including a plurality of word lines, a plurality of bit lines, and a plurality of memory cells disposed at intersections of the word lines and the bit lines. At least two of the word lines share a row address or at least two of the bit lines share a column address.

Each of the plurality of memory cells may include a variable resistance device and a diode device.

At least two of the word lines may share a row address, and a selected word line for a selection of a memory cell is configured to be maintained at a ground voltage level along with other word lines sharing the row address with the selected word line, and the remaining word lines are configured to have a voltage level of a power source voltage or a voltage level higher than the power source voltage.

Bit lines, other than a selected bit line, are configured to be maintained in a floating state when a read voltage or a write voltage is applied to the selected bit line.

At least two of the bit lines may share a column address, and bit lines, other than a selected bit line and bit lines having the same bit line position as the selected bit line, are configured to be maintained in a floating state when a read voltage or a write voltage is applied to the selected bit line.

The word lines may not share a row address, and word lines other than a selected word line are configured to have a voltage level of a power source voltage or a voltage level higher than the power source voltage when the selected word line is maintained at a ground voltage level.

The semiconductor memory device may include a phase change random access memory (PRAM) and/or a resistive random access memory (RRAM).

A semiconductor memory device according to further embodiments of the invention includes a first cell array layer including a plurality of first word lines extending in a first direction, a plurality of first bit lines extending in a second direction that intersects the first direction, and a plurality of first memory cells disposed at intersections of the first word lines and the first bit lines. Each of the first word lines has a word line position, each of the first bit lines has a bit line position, and each of the first memory cells includes a variable resistance device in series with a diode.

The device further includes a second cell array layer including a plurality of second word lines extending in the first direction, a plurality of second bit lines extending in the second direction, and a plurality of second memory cells disposed at intersections of the second word lines and the second bit lines. Each of the second word lines has a word line position, each of the second bit lines has a bit line position, and each of the second memory cells includes a variable resistance device in series with a diode.

The first cell array layer is displaced from the second cell array layer in a third direction that is perpendicular to the first and second directions, and the bit lines of each of the first and second cell array layers having a same bit line position are connected in common or the word lines of the first and second cell array layers having a same word line position are connected in common.

In some embodiments, the word lines of each of the first and second cell array layers having the same word line position are connected in common, and the device may further include a plurality of word line drivers, each of which is connected to commonly connected word lines of the first and second cell array layers.

The semiconductor memory device may further include a plurality of global bit lines, each of which corresponds to a bit line position, and a plurality of column selector transistors associated with each of the bit line positions. Each of the column selector transistors may be coupled to a respective one of the bit lines of the associated bit line position.

In some embodiments, the bit lines of each of the first and second cell array layers having the same bit line position are connected in common, and the device may further include a plurality of word line drivers, each of which is connected to a respective one of the word lines.

The semiconductor memory device may further include a plurality of global bit lines, each of which corresponds to a bit line position, and a plurality of column selector transistors associated with respective ones of the bit line positions. Each of the column selector transistors may be coupled to commonly connected bit lines of the first and second cell array layers.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIG. 7 illustrates timings for operations in a semiconductor memory device having the structure of FIG. 6.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

PRAM memory devices are well-suited for providing highly-integrated semiconductor memories. However, the level of integration of two-dimensional structures has almost reached a limit. Therefore, some embodiments of the invention provide a semiconductor memory device having a three-dimensional structure.

Figure 2:
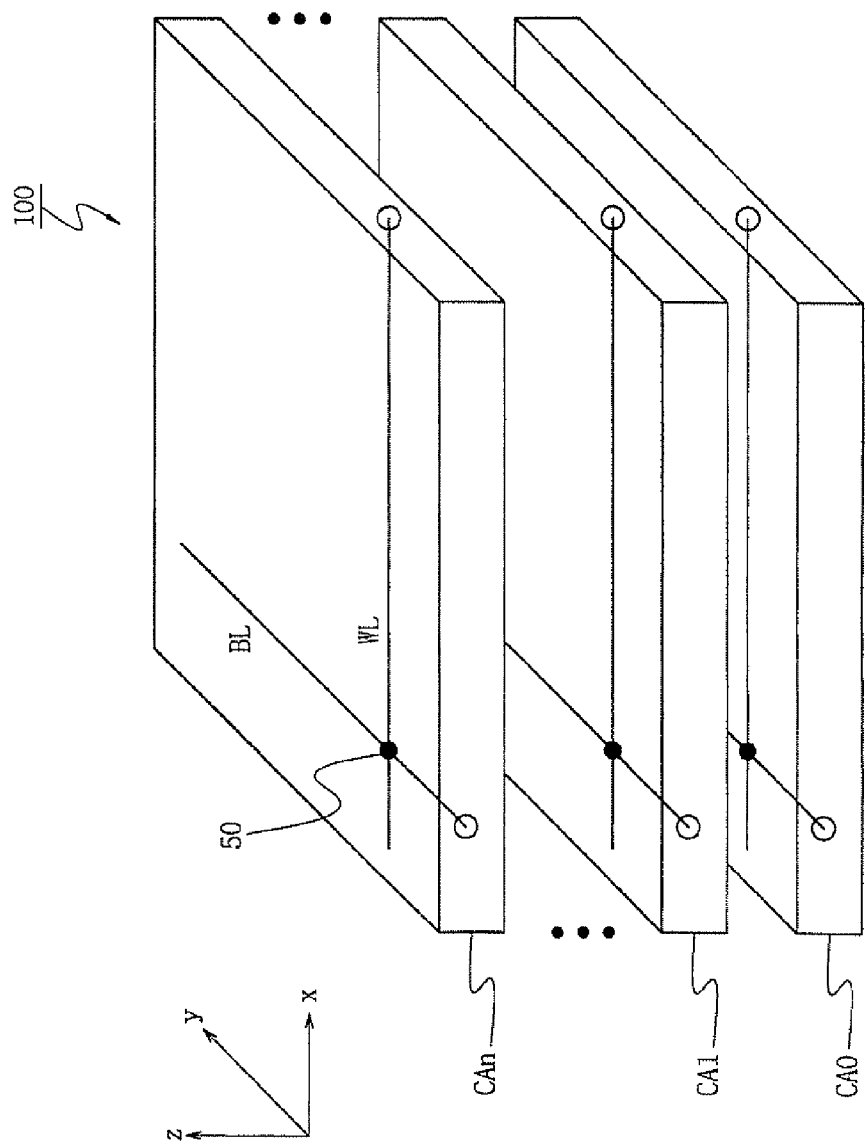
FIG. 2 illustrates a structure of a cell array of a semiconductor memory device according to some embodiments of the invention.

FIG. 2 illustrates a cell array structure of a semiconductor memory device according to some embodiments of the invention.

Referring to FIG. 2, a semiconductor memory device according to some embodiments of the invention has a three-dimensional laminated structure, and includes a plurality of cell array layers CA0~CAn.

Any one of the cell array layers CA0~CAn, e.g., cell array layer CA0, includes word lines WL that extend in a first direction (e.g. the x-direction), bit lines BL that extend in a second direction (e.g. the y-direction) that intersects the first direction, and memory cells 50 each disposed at intersections of the word lines WL and the bit lines BL. Any one cell array layer CA0 of the cell array layers CA0~CAn has a two-dimensional structure, and may be similar to a memory cell array structure of a general PRAM or RRAM semiconductor memory device.

The cell array layers CA0~CAn may be disposed in layers with a constant interval in a third direction (e.g. the z-direction) that is perpendicular to the first and second directions. Each of the memory cells constituting the cell array layers CA0~CAn may have a configuration like that shown in FIG. 1. A memory cell 50 includes a variable resistance device R and a diode device D. As illustrated in FIG. 2, the first direction may be an X axis direction, the second direction may be a Y axis direction, and the third direction may be a Z axis direction. However, the first direction may be a Y axis direction and the second direction may be an X axis direction.

Figure 3:
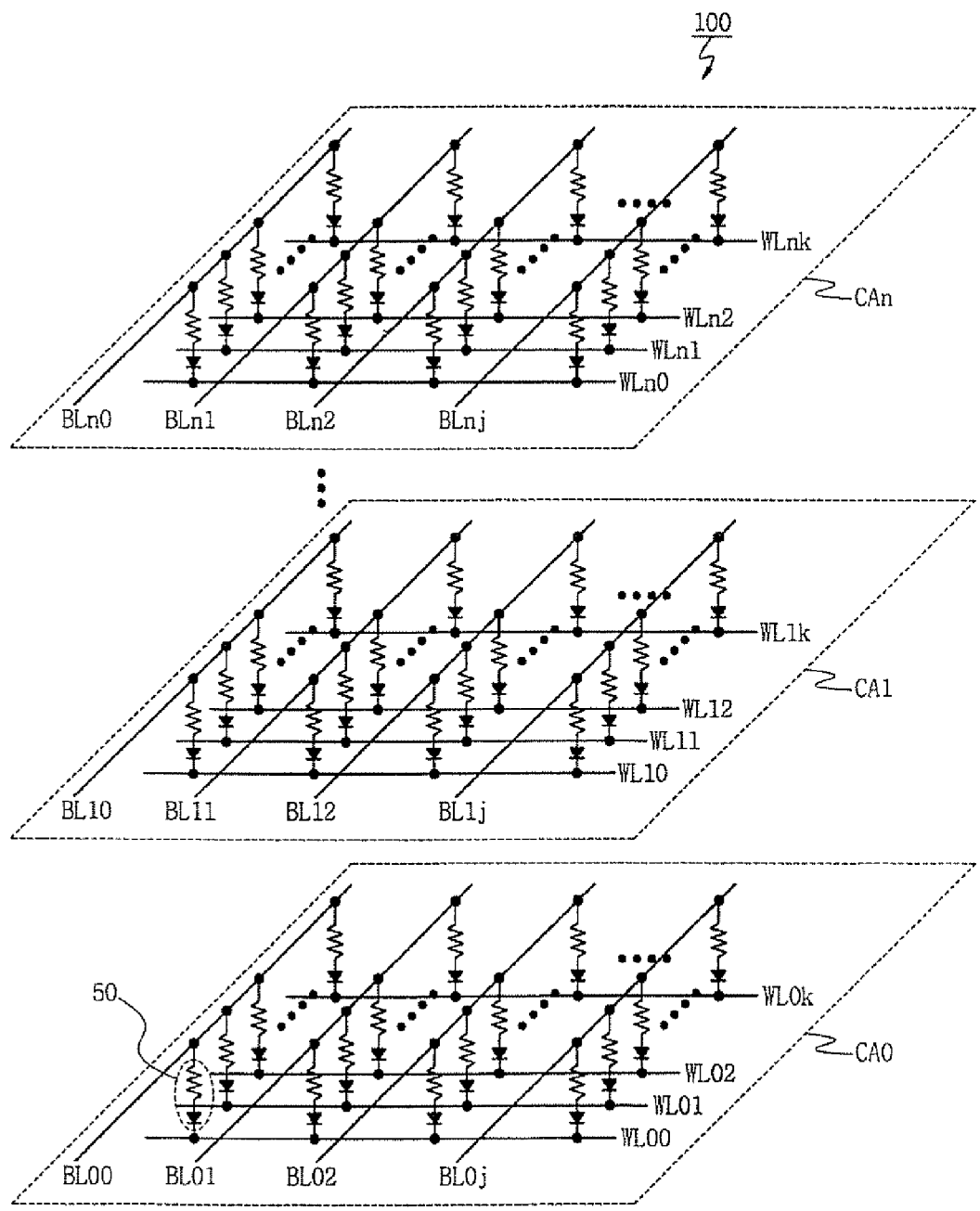
FIG. 3 illustrates a detailed example of FIG. 2.

FIG. 3 illustrates in detail an example of FIG. 2.

Although an equal number of word lines WL And bit lines BL are shown in the drawings, the number of word lines WL and the number of bit lines BL in a semiconductor memory device according to some embodiments of the invention may be unequal.

Figure 1:
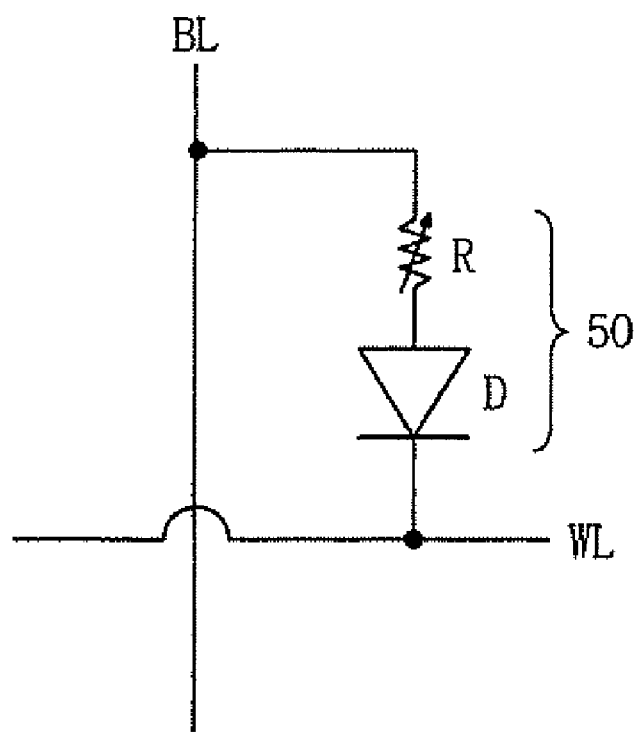
FIG. 1 is a circuit diagram of a conventional memory cell having a diode structure.

As shown in FIG. 3, on a 0th cell array layer CA0, a plurality, e.g., j+1, of bit lines BL00~BL0$j$ are disposed with a constant interval in a second direction as a length direction, and a plurality, e.g., k+1, of word lines WL00~WL0$k$ are disposed with a constant interval in a first direction as a length direction At intersections of the word lines WL and the bit lines BL, memory cells 50 are individually disposed. The memory cell 50 includes a variable resistance device and a diode device with a structure as shown in FIG. 1.

On a first cell array layer CA1, a plurality, e.g., j+1, of bit lines BL10~BL1$j$ are disposed with a constant interval in a second direction as a length direction, and a plurality, e.g., k+1, of word lines WL10~WL1$k$ are disposed with a constant interval in a first direction as a length direction. At intersections of these lines, memory cells are individually disposed. The first cell array layer CA1 may have the same or similar structure as the 0th cell array layer CA0. The remaining cell array layers CA2~CAn also have the same or similar structure as the 0th cell array layer CA0.

Diodes of memory cells within the cell array layers CA2~CAn may be formed of a material, such as amorphous silicon, SiGe, and/or poly-crystalline silicon. For example, a diode of the 0th cell array layer CA0 may be formed of poly-crystalline silicon, and diodes of the remaining cell array layers CA1~CAn may be formed of amorphous silicon and/or SiGe.

Figure 4:
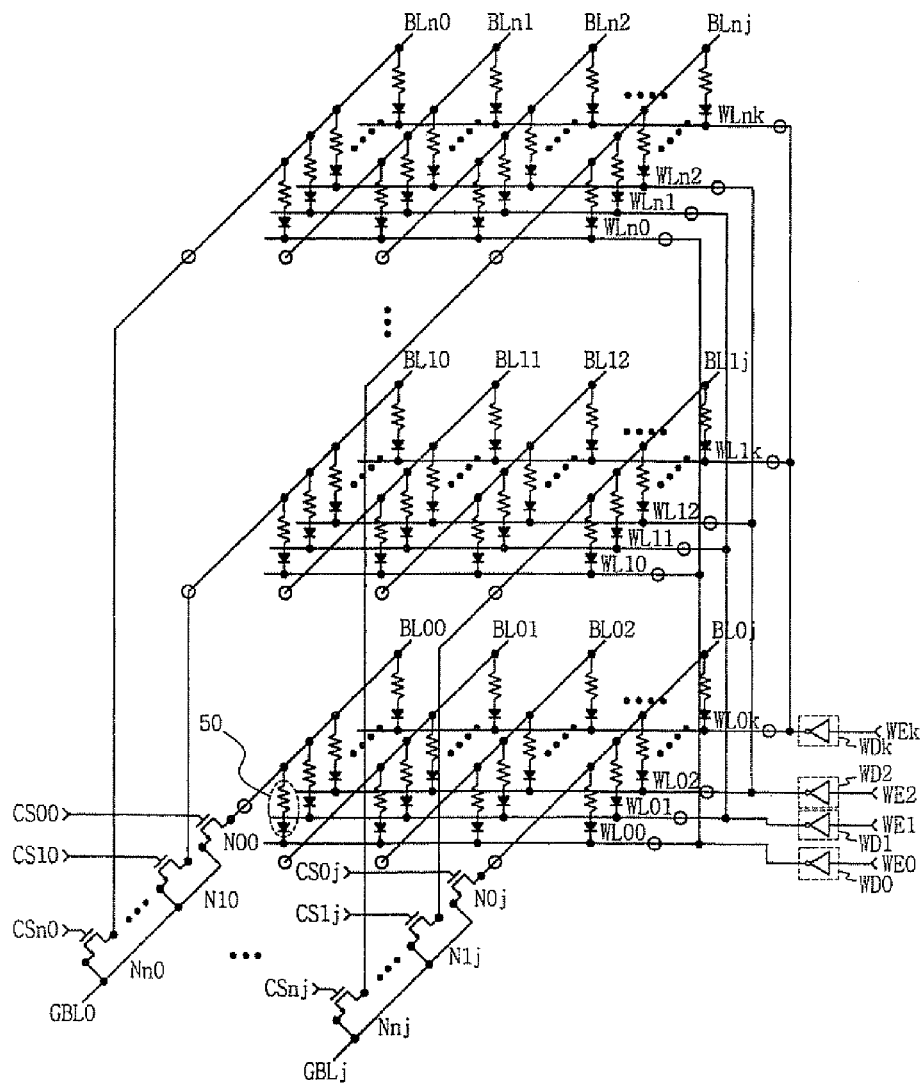
FIG. 4 illustrates a connection structure of word lines and bit lines in the structure of a cell array shown in FIGS. 2 and 3, according to some embodiments of the invention.

FIG. 4 illustrates a connection structure of word lines WL and bit lines BL in the structure of a cell array 100 shown in FIGS. 2 and 3 according to some embodiments of the invention.

As shown in FIG. 4, in the connection structure of word lines WL, word lines, e.g., WL00, WL10 . . . , WLn0, of respective ones of the respective cell array layers CA0~CAn, are connected in common.

For example, word lines, e.g., WL00, WL10 . . . , WLn0, disposed at the same position have a mutually common connection configuration. The word lines, e.g., WL00, WL10 . . . , WLn0, disposed on the same position may indicate word lines, e.g., WL00,WL10 . . . WLn0 per cell array layer CA0~CAn using the same row address per cell array layer CA0~CAn. That is, word lines, e.g., WL00, WL10 . . . WLn0, per cell array layer CA0~CAn having the same row address for the respective cell array layer CA0~CAn may be connected with each other.

Thus, for respective cell array layers CA0~CAn, a plurality of word lines can be enabled simultaneously by one row address. Accordingly, the row address applied to select a specific memory cell is provided with kinds corresponding to the number of word lines WL00~WL0k within one cell array layer, e.g., CA0, as in a conventional cell array structure.

Word lines, e.g., WL00, WL10 . . . , and WLn0 connected in common per cell array layer CA0~CAn, are controlled by one word line driver, e.g., WD0. In other words, word lines, e.g., WL00, WL10 . . . and WLn0, connected in common, may be enabled at the same time by one word line enable signal, e.g., WE0.

A connection structure of the bit lines BL according to some embodiments of the invention will be described as follows.

All of the bit lines BL individually disposed on each cell array layer CA0~CAn may operate independently. For example, in a column address applied to select a specific memory cell, the column address is provided corresponding to the number of the bit lines BL.

The bit lines BL are respectively connected with global bit lines GBL0~GBLj through column selector transistors N00~Nnj. The global bit lines GBL0~GBLj may be provided corresponding to the number of bit lines, e.g., BL00~BL0j, of one cell array layer, e.g., CA0. Bit lines, e.g., BL00, BL10~BLn0, disposed on the same position per cell array layer CA0~CAn from among the bit lines BL are connected in common to a global bit line, e.g., GBL0, of the global bit lines GBL0~GBLj through each selector transistor, e.g., N00~Nn0.

Bit lines, e.g., BL00, BL10~BLn0, disposed on the same position per cell array layer CA0~CAn may be bit lines, e.g., BL00,BL10~BLn0, per cell array layer CA0~CAn using the same column address per cell array layer CA0~CAn. In this case the number of bit lines enabled by one column address is only one.

Figure 5:
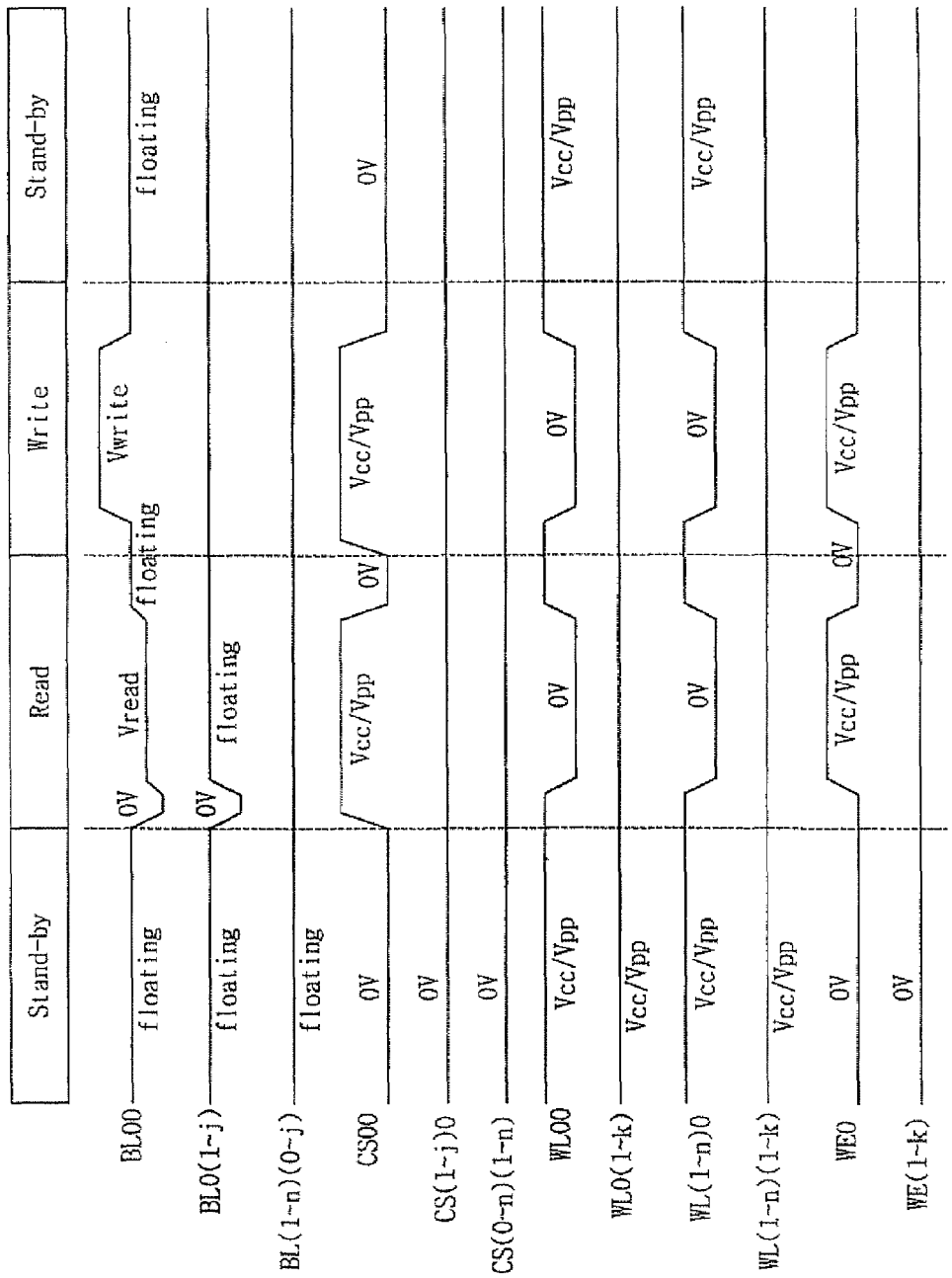
FIG. 5 illustrates timings for operations in a semiconductor memory device having the structure of FIG. 4.

FIG. 5 illustrates timings for operations including an active operation, such as a read operation or a write operation, in a semiconductor memory device having a structure as shown in FIG. 4.

FIG. 5 provides timings as an example, in reading data of a memory cell 50 disposed on an intersection of a 0th bit line BL00 and a 0th word line WL00 on a 0th cell array layer CA0, or in writing data to the memory cell 50.

As shown in FIG. 5, all bit lines BL maintain a floating state in a stand-by state, and all word lines WL maintain a power source voltage VCC, VDD or a state that a voltage VPP higher by a given level than the power source voltage VCC is applied.

In starting a read operation to read data of the memory cell 50, a word line WL00 and a bit line BL00 connected to the memory cell 50 are enabled to select the memory cell 50.

That is, a word line enable signal WE0 for a selection of a 0th word line WL00 of a 0th cell array layer CA0 is applied to the 0th word line driver WD0 with a power source voltage VCC or a level VPP higher than that.

The word line driver WD0 may include an inverter. When the word line enable signal WE0 is applied, the 0th word line WL00 of the 0th cell array layer CA0 and word lines WL(1~n)0 connected in common to the 0TH word line WL00 of the 0th cell array layer CA0 are all enabled by a ground level 0V. The word line enable signal WE0 is generated as a row address is applied.

A 0th global bit line GBL0 is selected to select a 0th bit line BL00 of cell array layer CA0, and a column selection signal CS00 is enabled to a level of power source voltage VCC or a level VPP higher than it. The column selection signal CS00 turns on the column selector transistor N00 connected to the 0th bit line BL00 of the 0th cell array layer CA0, to electrically connect the 0th bit line BL00 of the 0th cell array layer CA0 with the 0th global bit line GBL0. Thus, a read voltage Vread applied through the 0th global bit line GBL0 is transferred to the 0th bit line BL00 of the 0th cell array layer CA0. The remaining column selection signals CS(1~n)0, CS(0~n)(1~j) are maintained at a disable state of ground level.

The bit lines BL0(1~j), BL(1~n)(0~j) (i.e. all of the bit lines except the 0th bit line BL00 of the 0th cell array layer CA0) are maintained at a floating state. The 0th bit line BL00 of the 0th cell array layer CA0 or all bit lines BL0(0~j) of the 0th cell array layer CA0 may perform a discharge operation with a ground voltage 0V, for the 0th bit line BL00 of the 0th cell array layer CA0 or all bit lines BL0(0~j) of the 0th cell array layer CA0, when the read operation starts, that is, before the read voltage Vread is applied. As this operation is performed, the bit line is under the floating state, which can not be defined clearly (i.e. may be high or low). Thus, a discharge operation is performed so that a floating voltage of bit line may not influence the read operation. The bit lines BL are kept in a floating state in a standby state of the bit lines BL or when the bit lines BL are not selected, so as to prevent or substantially reduce a leakage current through the bit line BL.

Then, a level state of the 0th bit line BL00 of the 0th cell array layer CA0 is sensed and data is read.

A write operation is similar to the read operation, except that a write voltage Vwrite is applied to the 0th bit line BL00 of the 0th cell array layer CA0, and a discharge operation for the bit line may not be performed.

Figure 6:
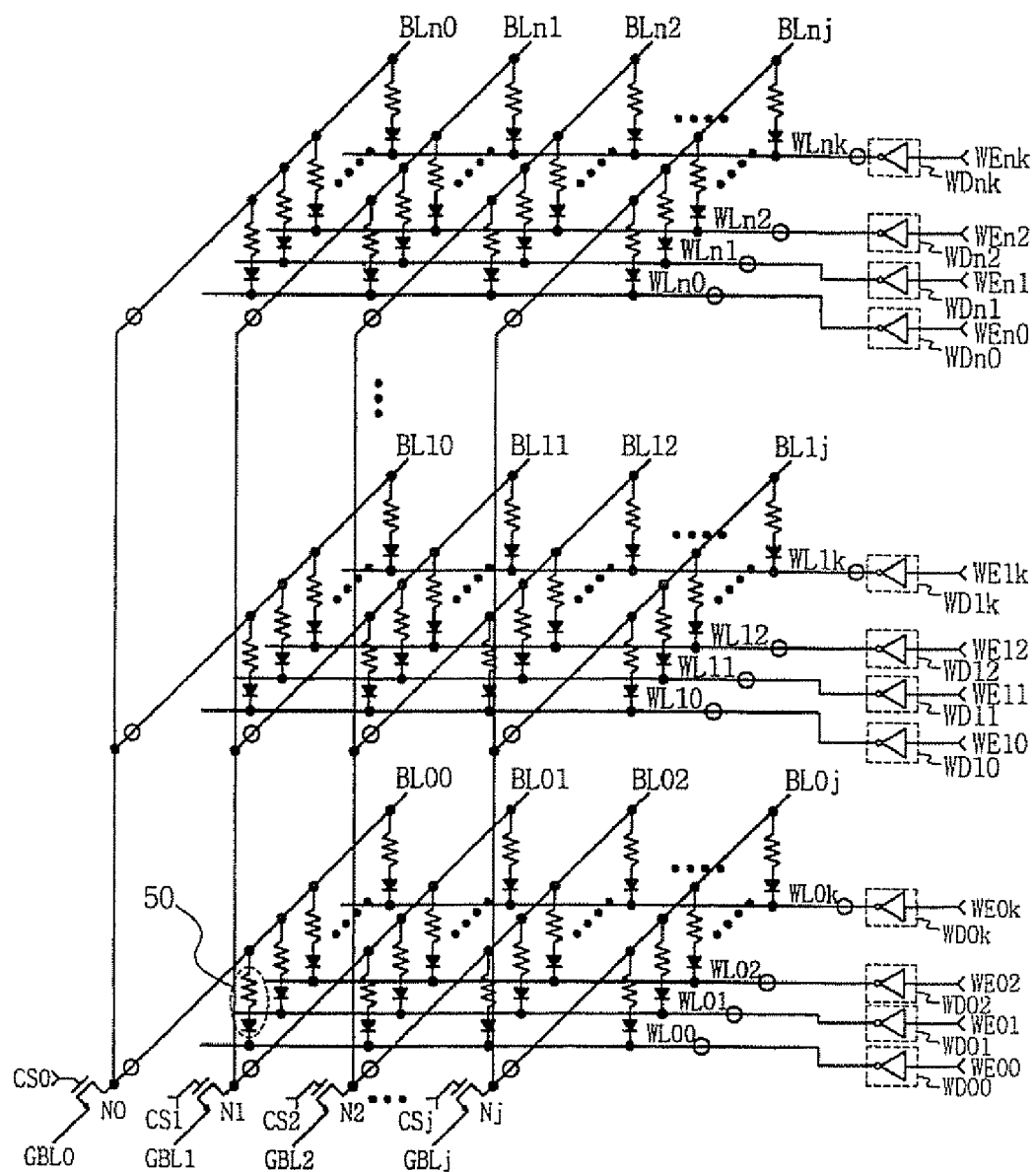
FIG. 6 illustrates a connection structure of word lines and bit lines in the structure of cell array shown in FIGS. 2 and 3 according to further embodiments of the invention.

FIG. 6 illustrates a connection structure of word lines WL and bit lines BL in the structure of cell array 100 of FIGS. 2 and 3 in a semiconductor memory device according to further embodiments of the invention.

In the connection structure of bit lines shown in FIG. 6, bit lines, e.g., BL00, BL10 . . . , and BLn0 of respective ones selected from respective cell array layers CA0~CAn are connected in common.

For example, bit lines, e.g., BL00, BL10 . . . , and BLn0, disposed at the same position, have a common connection configuration. The bit lines, e.g., BL00, BL10 . . . , and BLn0, disposed on the same position, may indicate bit lines, e.g., BL00,BL10 . . . , and BLn0, per cell array layer CA0~CAn using the same column address per each cell array layer CA0~CAn. Thus it may indicate that bit lines, e.g., BL00, BL10 . . . BLn0, of respective cell array layers CA0~CAn having the same column address for respective cell array layers CA0~CAn are connected with one another.

Accordingly a plurality of bit lines of respective ones selected from respective cell array layers CA0~CAn can be enabled simultaneously by using one column address. The column address applied to select a specific memory cell is provided with the kinds corresponding to the number of bit lines BL00~BL0j within one cell array layer, e.g., CA0.

Bit lines, e.g., BL00,BL10 . . . BLn0, connected in common per cell array layer CA0~CAn, are controlled by one selector transistor, e.g., N0. In other words, bit lines, e.g., BL00, BL10 . . . BLn0, connected in common, are enabled simultaneously by one column selection signal, e.g., CS0.

The bit lines BL are individually coupled to global bit lines GBL0~GBLj through column selector transistors N0~Nj. The global bit lines GBL0~GBLj may be provided corresponding to the number of bit lines, e.g., BL00~BL0j, of one cell array layer, e.g., CA0. Bit lines, e.g., BL00, BL10~BLn0, disposed on the same position per cell array layer CA0~CAn from among the bit lines BL are connected in common to any one global bit line, e.g., GBL0, of the global bit lines GBL0~GBLn through one selector transistor, e.g., N0.

A connection structure of word lines WL according to some embodiments of the invention will be described as follows.

All word lines WL individually disposed on each cell array layer CA0~CAn operate independently. For example, in a row address applied to select a specific memory cell, the row address is provided corresponding to the number of the word lines WL.

The word lines WL are each enabled through each of word line drivers WD00~WDnk. The word line drivers WD00~WDnk may be provided corresponding to the number of all word lines WL00~WLnk.

Word lines, e.g., WL00, WL10~WLn0, disposed at the same position on each cell array layer CA0~CAn may be word lines, e.g., WL00, WL10~WLn0, on each cell array layer CA0~CAn using the same row address for each cell array layer CA0~CAn. In this case the number of word lines enabled by one row address is one.

FIG. 7 illustrates timings for operation including an active operation, read operation or write operation, in a semiconductor memory device having the structure of FIG. 6.

FIG. 7 provides timings as an example, in reading data of memory cell 50 disposed on an intersection of 0th bit line BL00 and 0th word line WL00 on 0th cell array layer CA0, or in writing data to the memory cell 50.

As shown in FIG. 7, all bit lines BL maintain a floating state in a stand-by state, and all word lines WL maintain a power source voltage VCC, VDD, or a state that a voltage VPP that is higher than the power source voltage VCC, is applied.

In starting a read operation to read data of the memory cell 50, a bit line BL00 and a word line WL00 connected to the memory cell 50 are enabled to select the memory cell 50.

That is, a word line enable signal WE00 for a selection of 0th word line WL00 of 0th cell array layer CA0 is applied to the 0th word line driver WD0 with a level of power source voltage VCC or a level VPP that is higher than VCC.

The word line driver WD0 may include an inverter. When the word line enable signal WE00 is applied, only a 0th word line BL00 of the 0th cell array layer CA0 is enabled by a ground level 0V. The word line enable signal WE00 is generated by an applied row address. The remaining word lines WL0(1~k), WL(1~n)(0~k) maintain a power source voltage VCC as a standby state or a level VPP that is higher than VCC.

A 0th global bit line GBL0 is selected to select a 0th bit line BL00 of cell array layer CA0, and a 0th column selection signal CS0 is enabled to a level of power source voltage VCC or a level VPP higher than it. The 0th column selection signal CS0 turns on a selector transistor N0 connected to the 0th bit line BL00 of the 0th cell array layer CA0, to electrically connect the 0th bit line BL00 of the 0th cell array layer CA0 with the 0th global bit line GBL0. In the bit line BL electrically connected to the 0th global bit line GBL0, not only the 0th bit line BL00 but also bit lines BL10~BLn0 that are disposed on the same position of each cell array layer CA0~CAn and that are connected in common to the 0th bit line bl00, are included.

Thus, the read voltage Vread applied through the 0th global bit line GBL0 is transferred to 0th bit line BL00 of the 0th cell array layer CA0 and bit lines BL(1~n)0 connected in common to the 0th global bit line GBL0. The remaining column selection signals CS1~CSj maintain a disable state of ground level.

The remaining bit lines BL(1~n)(1~j) (i.e., all of the bit lines BL except the 0th bit line BL00 of the 0th cell array layer CA0 and the bit lines BL(1~n)0 connected to the 0th bit line BL00) maintain a floating state. The 0th bit line BL00 of the 0th cell array layer CA0 and the bit lines BL(1~n)0 connected to the 0th bit line BL00, and all bit lines BL0(0~j) of the 0th cell array layer CA0 can perform a discharge operation when the read operation starts, that is, before the read voltage Vread is applied. This is why the bit lines are under the floating state and so the state cannot be defined clearly, thus the discharge is performed so as not to influence the read operation due to a floating voltage. Further, the bit lines BL are maintained in the floating state under a standby state or when they are not selected, in order to prevent or substantially reduce leakage current.

Then, a level state of the 0th bit line BL00 of the 0th cell array layer CA0 is sensed and data is read. Even if the 0th bit line BL00 of the 0th cell array layer CA0, and the bit lines BL(1~n)0 connected thereto, are all selected, word lines WL are independent, thus it is possible to select a memory cell 50 connected to the 0th word line WL00 of the 0the cell array layer CA0.

In a write operation, the same operation is performed as the read operation, except that a write voltage Vwrite is applied to the 0th bit line BL00, and a discharge operation for the bit line may not be performed.

As described above, in a semiconductor memory device having a memory cell of a diode structure according to some embodiments of the invention, a three-dimensional laminated cell array structure is provided. The structure may be capable of performing a normal operation by controlling a bias condition of a word line or bit line. Accordingly, a leakage current can be reduced and/or a high level of integration can be obtained.

As described above, according to some embodiments of the invention, the structure of a cell array has a three-dimensional laminated structure and the bias condition of word lines or bit lines may be controlled so as to perform a normal operation, thereby reducing leakage current and/or obtaining a high level of integration.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor memory device, comprising:
a plurality of cell array layers including a plurality of word lines extending in a first direction, a plurality of bit lines extending in a second direction that intersects the first direction, and a plurality of memory cells disposed at intersections of the word lines and the bit lines, each of the memory cells including a variable resistance device in series with a diode;
wherein the cell array layers are arranged in layers in a third direction that is perpendicular to the first and second directions; and
wherein respective bit lines of each of the cell array layers are connected in common to respective column selector transistors or respective word lines of the cell array layers are connected in common to respective word line drivers;
wherein bit lines other than a selected bit line are configured to be maintained at a floating state when a read voltage or a write voltage is applied to the selected bit line; and
wherein bit lines in a cell array layer of the selected bit line are configured to be discharged to a ground voltage prior to a read operation.

2. The device of claim 1, wherein the word lines having the same word line position are connected to respective common word line drivers, the device further comprising a plurality of column selector transistors, each of the column selector transistors coupled to a respective bit line of a respective cell array layer so that respective bit lines of the respective cell array layers have mutually different addresses.

3. The device of claim 2, wherein a word line selected for a selection of a memory cell is configured to be maintained at a ground voltage level together with other commonly connected word lines, and the remaining word lines are configured to be maintained at a voltage level of a power source voltage or a voltage level higher than the power source voltage.

4. The device of claim 1, wherein commonly connected bit lines of each of the cell array layers are connected to the common column selector transistor, the device further comprising a plurality of word line drivers each coupled to a respective word line of a respective cell array layer so that respective word lines of the cell array layers have mutually different addresses and are individually driven by the respective word line drivers.

5. The device of claim 4, wherein a word line selected for the selection of a memory cell is configured to be maintained at a ground voltage level, and the remaining word lines are configured to have a voltage level of a power source voltage or a voltage level higher than the power source voltage.

6. The device of claim 5, wherein bit lines, other than a selected bit line and bit lines commonly connected with the selected bit line, are configured to be maintained at a floating state when a read voltage or a write voltage is applied to the selected bit line.

7. The device of claim 1,
wherein the diode of each of the memory cells comprises amorphous silicon, SiGe, and/or poly-crystalline silicon.

8. A cell array structure of a semiconductor memory device, comprising:
a plurality of word lines, a plurality of bit lines, and a plurality of memory cells disposed at intersections of the word lines and the bit lines;
wherein at least two of the word lines share a row address or at least two of the bit lines share column address;
wherein the plurality of memory cells each comprise a variable resistance device and a diode device;
wherein at least two of the word lines share a row address, and wherein a selected word line for a selection of a memory cell is configured to be maintained at a ground voltage level along with other word lines sharing the row address with the selected word line, and the remaining word lines are configured to have a voltage level of a power source voltage or a voltage level higher than the power source voltage;
wherein bit lines other than a selected bit line are configured to be maintained at a floating state when a read voltage or a write voltage is applied to the selected bit line; and
wherein bit lines in a cell array layer of the selected bit line are configured to be discharged to a ground voltage prior to a read operation.

9. The structure of claim 8, wherein at least two of the bit lines share a column address; and
wherein bit lines, other than a selected bit line and bit lines having the same bit line position as the selected bit line, are configured to be maintained in a floating state when a read voltage or a write voltage is applied to the selected bit line.

10. The structure of claim 9, wherein the word lines do not share a row address; and
wherein word lines other than a selected word line are configured to have a voltage level of a power source voltage or a voltage level higher than the power source voltage when the selected word line is maintained at a ground voltage level.

11. The structure of claim 8, wherein the semiconductor memory device comprises a phase change random access memory (PRAM) and/or a resistive random access memory (RRAM).

12. A semiconductor memory device, comprising:
a first cell array layer including a plurality of first word lines extending in a first direction, a plurality of first bit lines extending in a second direction that intersects the first direction, and a plurality of first memory cells disposed at intersections of the first word lines and the first bit lines, each of the first word lines having a word line position, each of the first bit lines having a bit line position, and each of the first memory cells including a variable resistance device in series with a diode;
a second cell array layer including a plurality of second word lines extending in the first direction, a plurality of second bit lines extending in the second direction, and a plurality of second memory cells disposed at intersections of the second word lines and the second bit lines, each of the second word lines having a word line position, each of the second bit lines having a bit line position, and each of the second memory cells including a variable resistance device in series with a diode;
wherein the first cell array layer is displaced from the second cell array layer in a third direction that is perpendicular to the first and second directions; and
wherein the bit lines of each of the first and second cell array layers having a same bit line position are connected in common or the word lines of the first and second cell array layers having a same word line position are connected in common;
wherein bit lines other than a selected bit line are configured to be maintained at a floating state when a read voltage or a write voltage is applied to the selected bit line; and
wherein bit lines in a cell array layer of the selected bit line are configured to be discharged to a ground voltage prior to a read operation.

13. The semiconductor memory device of claim 12, wherein the word lines of each of the first and second cell array layers having the same word line position are connected in common, the device further comprising:
a plurality of word line drivers, each of the word line drivers being connected to commonly connected word lines of the first and second cell array layers.

14. The semiconductor memory device of claim 13, further comprising:
a plurality of global bit lines, each of the global bit lines corresponding to a bit line position; and
a plurality of column selector transistors associated with each of the bit line positions, each of the column selector transistors being coupled to a respective one of the bit lines of the associated bit line position.

15. The semiconductor memory device of claim 12, wherein the bit lines of each of the first and second cell array layers having the same bit line position are connected in common, the device further comprising:

a plurality of word line drivers, each of the word line drivers being connected to a respective one of the word lines.

16. The semiconductor memory device of claim 15, further comprising:

a plurality of global bit lines, each of the global bit lines corresponding to a bit line position; and a plurality of column selector transistors associated with respective ones of the bit line positions, each of the column selector transistor being coupled commonly connected bit lines of the first and second cell array layers.

* * * * *